United States Patent
Chang et al.

(10) Patent No.: US 8,642,451 B2
(45) Date of Patent: Feb. 4, 2014

(54) ACTIVE REGION PATTERNING IN DOUBLE PATTERNING PROCESSES

(75) Inventors: Feng-Ming Chang, Chia-Yi (TW);
Chang-Ta Yang, Hsin-Chu (TW);
Huai-Ying Huang, Jhonghe (TW);
Ping-Wei Wang, Hsin-Chu (TW);
Hsiang-Lin Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 110 days.

(21) Appl. No.: 12/917,205

(22) Filed: Nov. 1, 2010

(65) Prior Publication Data

US 2012/0108036 A1    May 3, 2012

(51) Int. Cl.
*H01L 21/20* (2006.01)

(52) U.S. Cl.
USPC ..................................... 438/478; 257/E21.09

(58) Field of Classification Search
None
See application file for complete search history.

(56) References Cited

U.S. PATENT DOCUMENTS

| | | | |
|---|---|---|---|
| 7,535,751 B2 | 5/2009 | Huang et al. | |
| 2005/0176193 A1* | 8/2005 | Kang et al. | 438/197 |
| 2008/0083991 A1* | 4/2008 | Yang et al. | 257/758 |
| 2009/0168498 A1* | 7/2009 | Pillarisetty et al. | 365/154 |

* cited by examiner

*Primary Examiner* — Seahvosh Nikmanesh
(74) *Attorney, Agent, or Firm* — Slater & Matsil, L.L.P.

(57) ABSTRACT

A method includes forming an SRAM cell including a first and a second pull-up transistor and a first and a second pull-down transistor. The step of forming the SRAM cell includes forming a first and a second active region of the first and the second pull-up transistors using a first lithography mask, and forming a third and a fourth active region of the first and the second pull-down transistors using a second lithography mask.

20 Claims, 13 Drawing Sheets

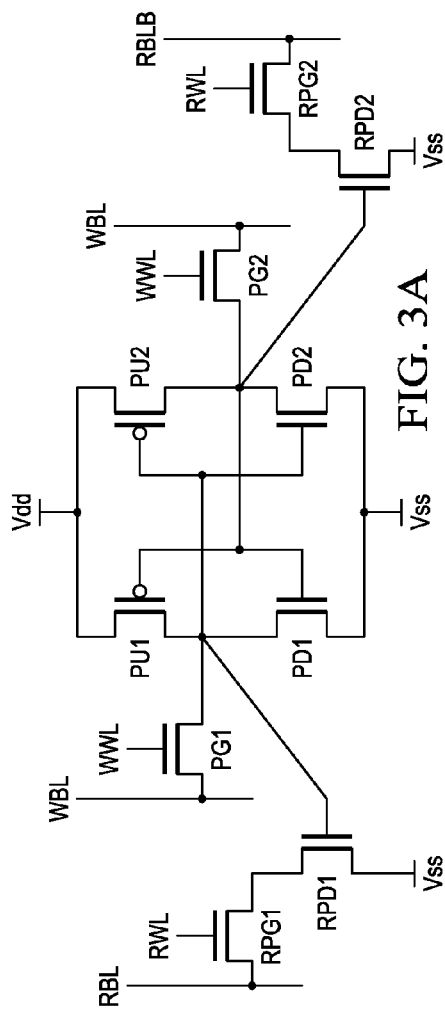
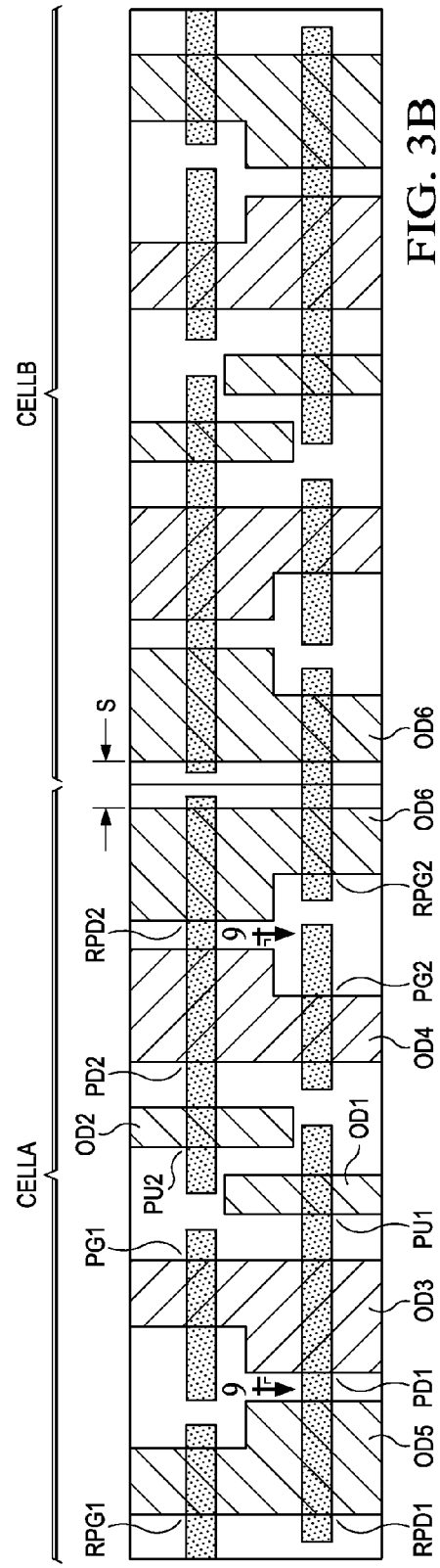

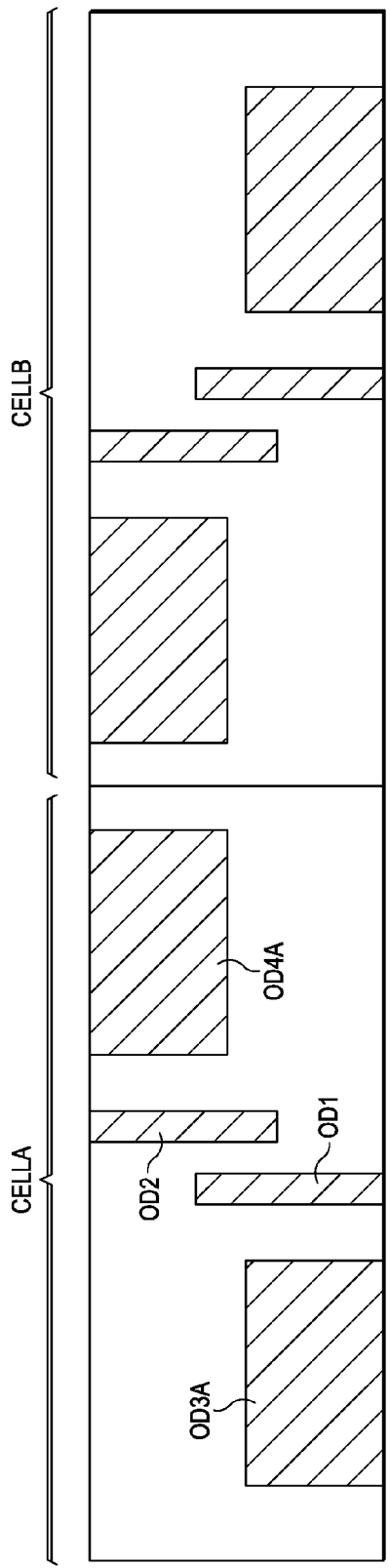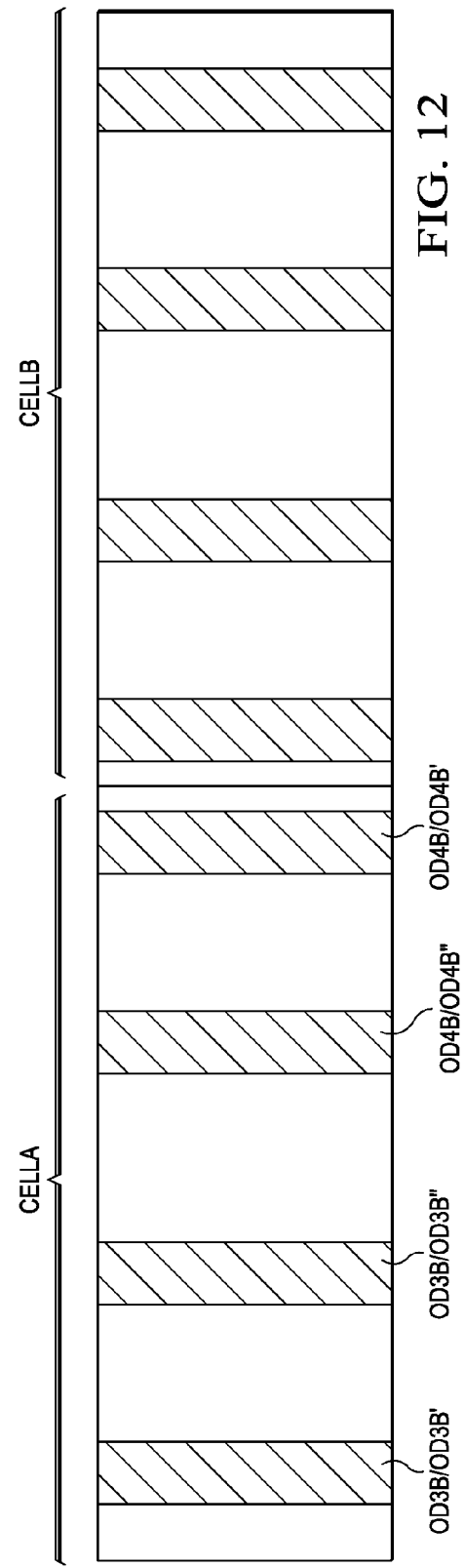

ACTIVE REGION PATTERNING IN DOUBLE PATTERNING PROCESSES

BACKGROUND

Double patterning is a technology developed for lithography to enhance the feature density. Typically, for forming features of integrated circuits on wafers, lithography technology is used, which involves applying a photo resist, and defining patterns on the photo resist. The patterns in the patterned photo resist are first defined in a lithography mask, and are implemented either by the transparent portions or by the opaque portions in the lithography mask. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 4 illustrate circuit diagrams and layouts of static random access memory (SRAM) cells in accordance with embodiments, in which the active regions of two pull-up transistors are allocated in a same lithography mask;

FIGS. 10A through 14 illustrate circuit diagrams and layouts of static random access memory (SRAM) cells in accordance with alternative embodiments, in which U-shaped active regions are formed.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of forming static random access memory (SRAM) cells is provided in accordance with an embodiment. The intermediate stages of manufacturing various embodiments are illustrated. The variations and the operation of the embodiments are discussed. Throughout the various views and illustrative embodiments, like reference numbers are used to designate like elements. Throughout the description, for the formation of active regions of SRAM cells, two lithography masks are used, and the patterns of active regions having the same shading are in a same lithography mask, while the patterns with different shadings are on different lithography masks. Furthermore, the pattern of an active region in a layout and the actually active region formed in a wafer may both be referred to as "active regions." It is appreciated that, however, the active regions in layouts and lithography masks are actually the patterns of the active regions.

Figure 1A:
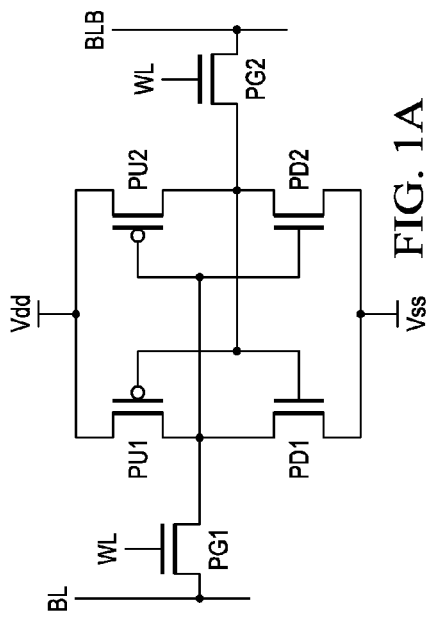

FIG. 1A illustrates a circuit diagram of a six-transistor (6-T) single-port SRAM cell, which includes pull-up transistors PU1 and PU2, pull-down transistors PD1 and PD2, and pass-gate transistors PG1 and PG2. Bit-lines BL and BLB and word line WL are connected to the 6-T SRAM cell. The operation of the 6-T SRAM cell is known in the art, and hence is not discussed herein.

Figure 1B:
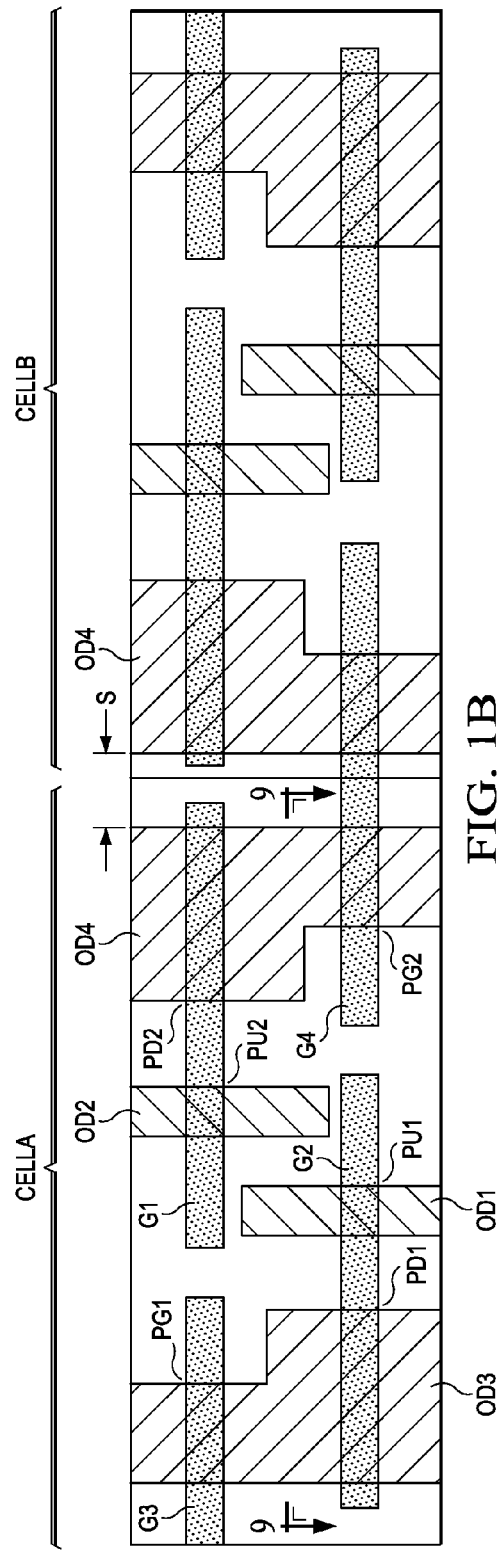

FIG. 1B illustrates a layout of the 6-T SRAM cell as in FIG. 1A in accordance with an embodiment. Two 6-T SRAM cells CellA and CellB are illustrated as neighboring cells. Active regions OD1 and OD2 (also refer to FIG. 9) are active regions of pull-up transistors PU1 and PU2, which active regions are used to form source and drain regions and channels of the respective transistors. Active regions OD3 and OD4 (also refer to FIG. 9) are active regions of pull-down transistors PD1 and PD2 and pass-gate transistors PG1 and PG2. Active regions OD1, OD2, OD3, and OD4 may be laid out in a rotationally symmetrical pattern, which means the active regions are symmetrical relative to a central point.

Gate electrodes G1 through G4 are also shown, and form transistors with the underlying active regions, which transistors are also marked. Active regions OD1 and OD2, which are active regions of pull-up transistors PU1 and PU2, respectively, are formed in the middle of the respective SRAM cell, and are next to each other, with no other active regions therebetween. Active regions OD1 and OD2 are formed (and defined) using a same lithography mask (refer to mask 28 in FIG. 5), which is different from the lithography mask (refer to mask 34 in FIG. 7) for forming and defining active regions OD3 and OD4. In an embodiment, active regions OD4 of neighboring SRAM cells CellA and CellB are on a same lithography mask.

Figure 2A:
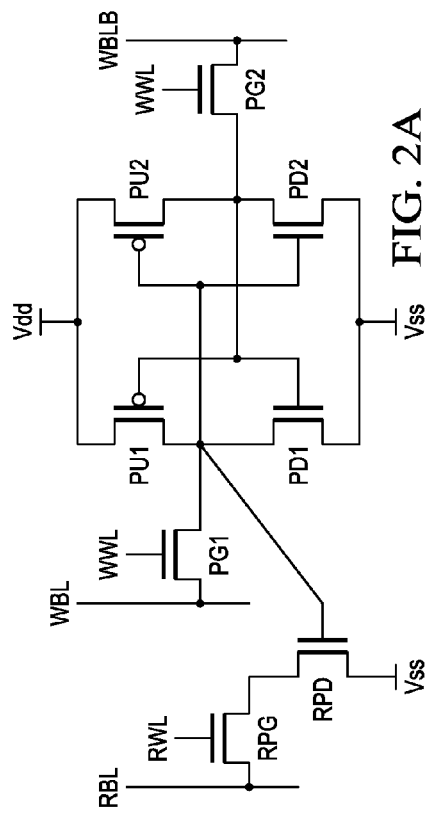
Figure 2B:
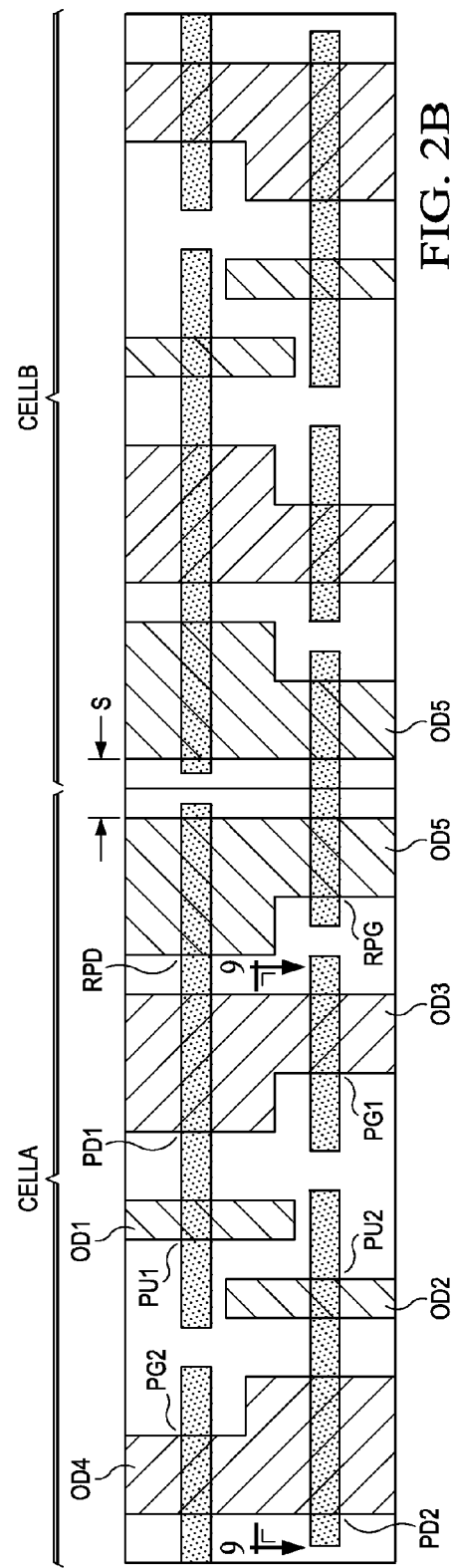

FIG. 2A illustrates a circuit diagram of an eight-transistor (8-T) dual-port SRAM cell, which, besides pull-up transistors PU1 and PU2, pull-down transistors PD1 and PD2, and pass-gate transistors PG1 and PG2, also includes read pass-gate transistor RPG and read pull-down transistor RPD. The 8-T dual-port SRAM cell is connected to read bit-line RBL, write bit-lines WBL and WBLB, read word-line WWL, and write word-line RWL. FIG. 2B illustrates a layout of the 8-T dual-port SRAM cell as shown in FIG. 2A, with the active region and the respective transistors formed of the active regions as marked. There are five active regions OD1 through OD5 in each SRAM cell (CellA and CellB), with the transistors formed using these active regions being marked. Active regions OD1, OD2, and OD5 are formed using a same lithography mask, while active regions OD3 and OD4 are formed using another lithography mask. Active regions OD1 through OD4 may also be laid out in a rotationally symmetrical pattern. In an embodiment, active regions OD5 of neighboring SRAM cells CellA and CellB are on a same lithography mask.

FIG. 3A illustrates a circuit diagram of a ten-transistor (10-T) dual-port SRAM cell, which includes two read pass-gate transistors RPG1 and RPG2, each belonging to one port, and two read pull-down transistors RPD1 and RPD2, each belonging to one port. FIG. 3B illustrates a layout of the 10-T dual-port SRAM cell, with the active region and the respective transistors formed of the active regions marked. In addition to active regions OD1 through OD4, active regions OD5 and OD6 are added. Similar to the embodiment shown in FIG. 1A, active regions OD1 and OD2 are formed using a same lithography mask, which is also used to form active regions OD5 and OD6. Active regions OD3 and OD4 are formed using a same lithography mask, which is different from the mask for forming active regions OD1, OD2, OD5 and OD6.

Figure 4:
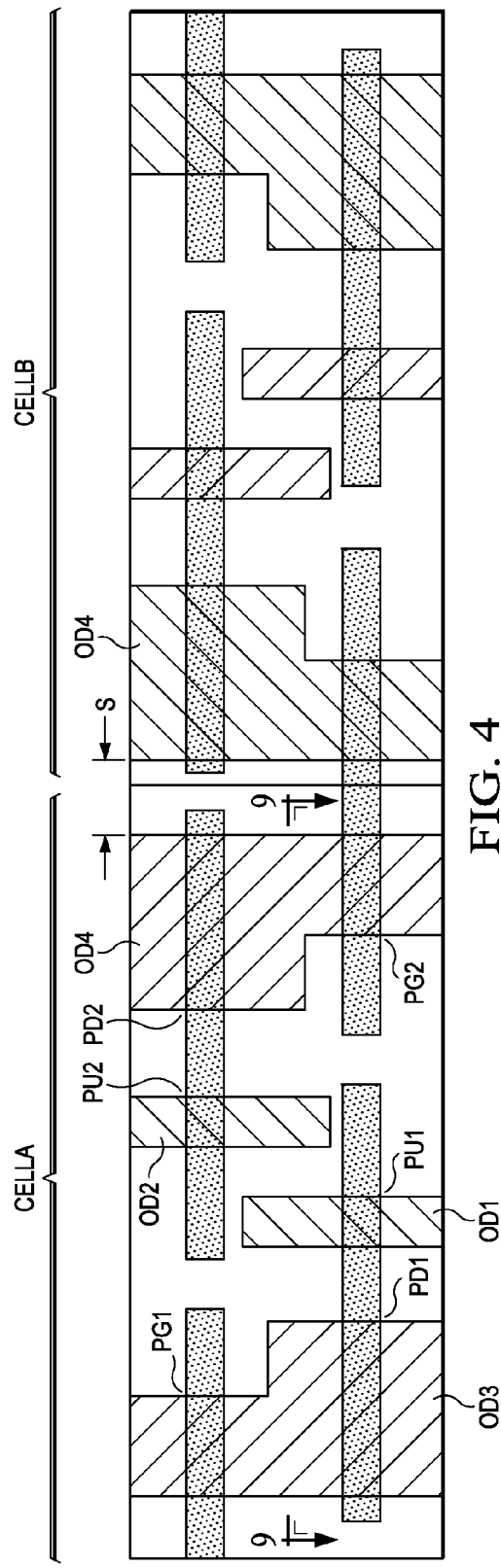

In the embodiments shown in FIGS. 1B, 2B, and 3B, the boundary active regions (such as active regions OD4, OD5, and OD6 in FIGS. 1B, 2B, and 3B, respectively) in neighboring SRAM cells CellA and CellB are in the same lithography mask. This requires spacing S to be no smaller than the minimum allowable spacing (known as G1 spacing in the art) in the same mask. In alternative embodiments, as shown in FIG. 4, boundary active regions OD4 in neighboring SRAM cells CellA and CellB are decomposed to different lithography masks. Accordingly, spacing S can be reduced. Due to the reduction in spacing S, the size of the SRAM cells is reduced. This embodiment may be used for large SRAM cells, in which the reduction in SRAM cell is significant. The embodiments shown in FIGS. 1B, 2B, and 3B may be used for small SRAM cells having sizes smaller than the large SRAM cells. The large and small SRAM cells may be formed on a same chip. Accordingly, the patterns of their active regions will be formed on the same lithography mask set.

In each of FIGS. 1B, 2B, 3B, 4, and in the subsequently illustrated FIGS. 10B through 14, active regions OD1 and OD2, which are active regions of pull-up transistors PU1 and PU2, respectively, are formed in the middle of the respective SRAM cell, and are immediately next to each other, with no other active regions of any other transistors disposed therebetween. Furthermore, active regions OD4 (or OD3, OD5, OD6, or the like) in neighboring SRAM cells may be immediately next to each other, with no other active regions of any other transistors disposed therebetween.

FIGS. 5 through 9 illustrate the cross-sectional views of intermediate stages in the manufacturing of transistors and respective active regions in SRAM cells. It is noted that the formation of transistors and the respective active regions using the lithography masks as discussed in previous paragraphs may have many embodiments, which are also in the scope of the present disclosure, while the embodiments shown in FIGS. 5 through 9 are exemplary. The cross-sectional views may be obtained from the planes crossing line 9-9 in FIGS. 1B, 2B, 3B, and 4.

Figure 5:
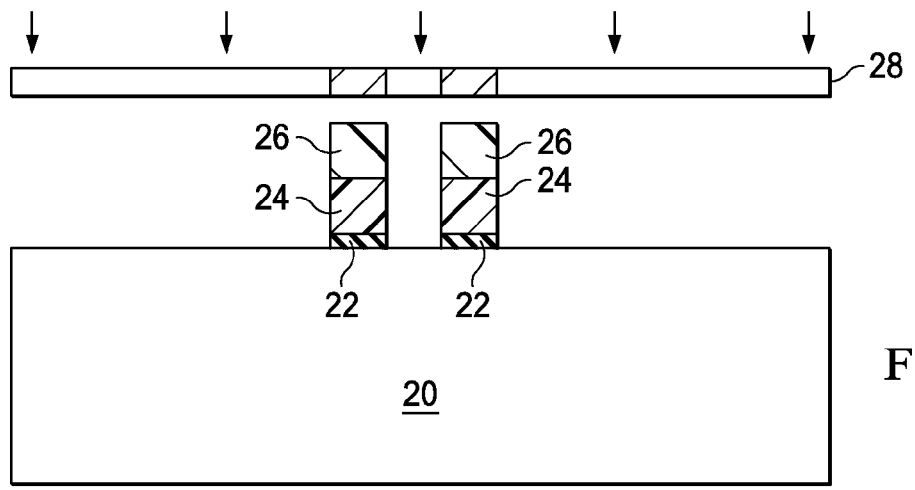
FIGS. 5 through 9 are cross-sectional views of intermediate stages in the manufacturing of active regions of an SRAM cell.

Referring to FIG. 5, semiconductor substrate 20 is provided. Semiconductor substrate 20 may be a silicon substrate, or formed of other semiconductor materials. Pad oxide layer 22, which may be formed of silicon oxide, is formed. Hard mask layer 24 is formed over pad oxide layer 22. Photo resist 26 is also formed. It is noted that although hard mask layer 24 is shown as a single layer, it may also be formed of composite layers including, for example, an ashing removable dielectric (ARD) layer (which may include amorphous silicon), a plasma enhanced (PE) oxide layer, a silicon oxynitride layer, an anti-reflective coating (ARC), and the like. Further, photo resist layer 26 may also include more than one photo resist layer, for example, the commonly known bottom layer, middle layer, and the like. The patterning of pad oxide layer 22, hard mask 24, and photo resist 26 are performed using lithography mask 28, which includes the patterns of active regions OD1 and OD2 as shown in FIGS. 1B, 2B, 3B, and 4. Although other patterns on the same mask (which patterns include the patterns of active regions OD5 in FIG. 2B and OD5/OD6 in FIG. 3B) are not shown in lithography mask 28, they may also exist.

Figure 6:
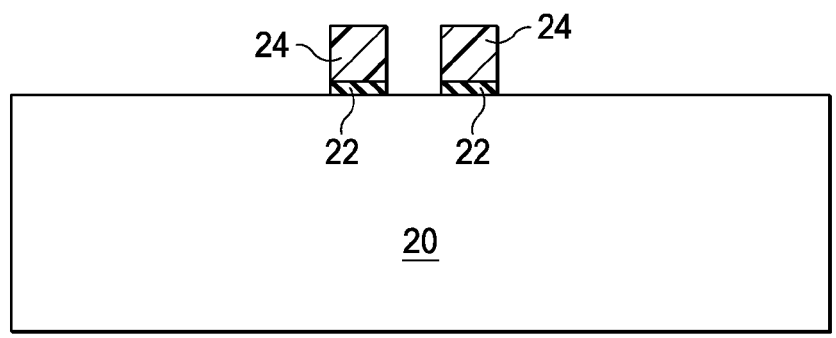
Figure 7:
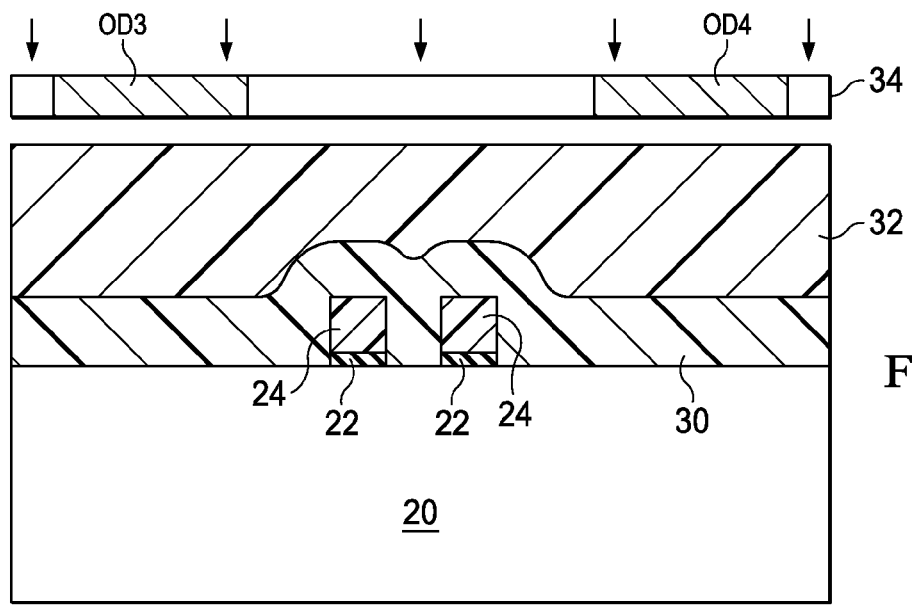

Next, as shown in FIG. 6, photo resist 26 is removed, leaving hard mask 24 and pad oxide 22. In FIG. 7, another hard mask layer 30 is formed to cover the structure shown in FIG. 6. Photo resist 32 is also formed. Again, hard mask layer 30 and photo resist 32 may also be composite layers. Hard mask layer 30 is then patterned, forming the pattern shown in FIG. 8. The patterning of hard mask 30 is performed using lithography mask 34, which includes the patterns of active regions OD3 and OD4 as shown in FIGS. 1B, 2B, 3B, and 4. Although other patterns on the same mask are not shown in lithography mask 34, they may also exist.

Figure 8:
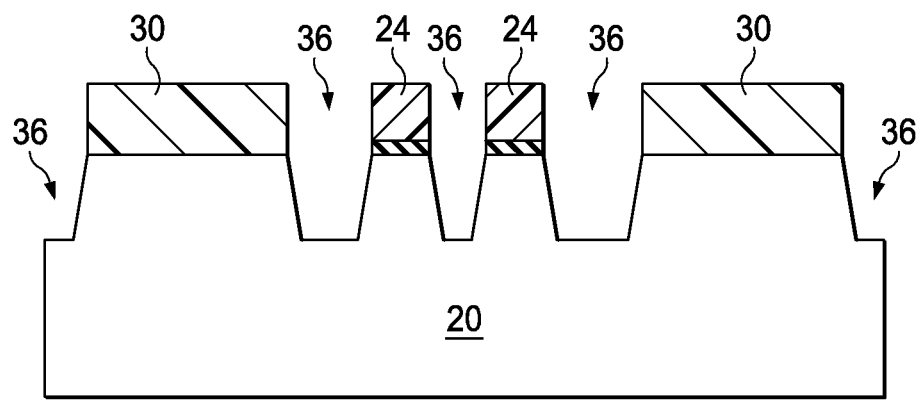
Figure 9:
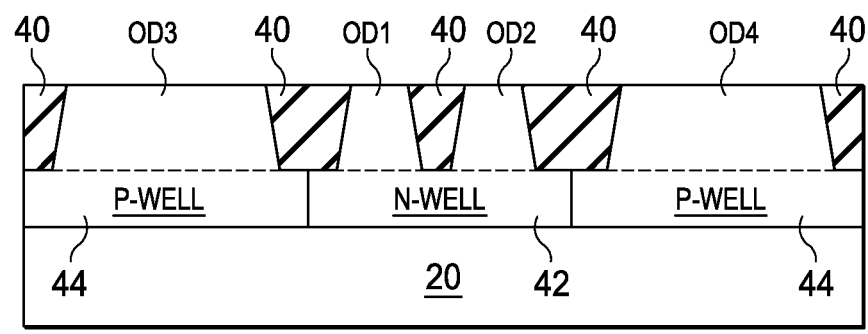

FIG. 8 also illustrates the etching of semiconductor substrate 20 for forming trenches 36. In FIG. 9, trenches 36 are filled with dielectric materials to form shallow-trench isolation (STI) regions 40. Further, one or more n-type impurity implantation may be performed to form n-well region 42 in semiconductor substrate 20, and one or more p-type impurity implantation may be performed to form p-well region 44 in semiconductor substrate 20. The portions of n-well region 42 surrounded by STI regions 40 form active regions OD1 and OD2, and the portions of p-well region 44 surrounded by STI regions 40 form active regions OD3 and OD4.

In subsequent process steps, gate dielectrics, gate electrodes, source and drain regions (not shown), and the like, are formed to finish the formation of the transistors as shown in FIGS. 1 through 4. The formation details are known in the art, and hence are not discussed herein.

Figure 10A:
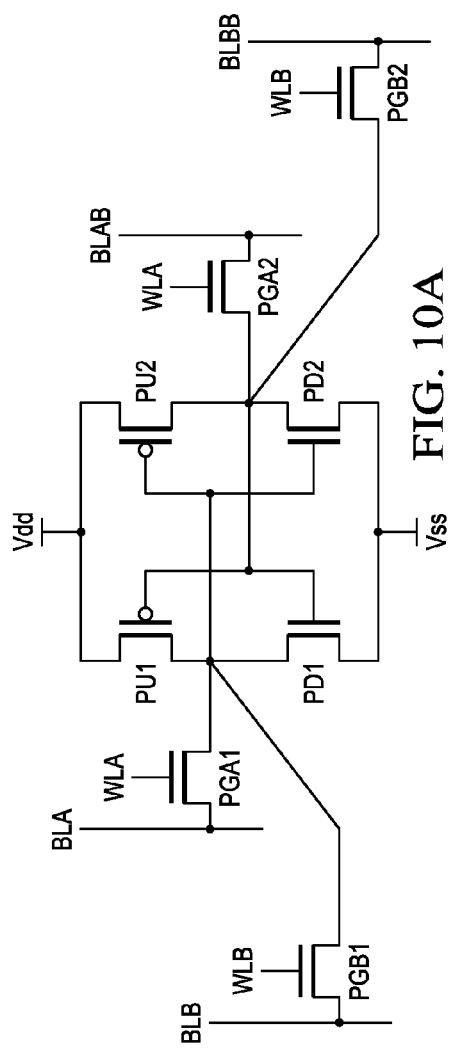

FIGS. 10A through 19 illustrate alternative embodiments. Unless specified otherwise, the reference notations in these embodiments represent like elements in the embodiments illustrated in FIGS. 1A through 9. An exemplary circuit diagram is shown in FIG. 10A, which illustrates an 8-T dual-port SRAM cell. The meaning of reference notations PGA1, PGB1, PGA2, PGB2, BLB, BLBB, BLA, BLAB, WLA, and the like are known in the art, and are not discussed herein. The layout of the 8-T dual-port SRAM cell is shown in FIG. 10B. Each of SRAM cells CellA and CellB includes active regions OD1 and OD2 of pull-up transistors PU1 and PU2, respectively. Further, each of SRAM cells CellA and CellB includes U-shaped active regions OD3 and OD4. The arms of U-shaped active region OD3 are used to form pass-gate transistors PGA1 and PGB1, while the bottom part of U-shaped active region OD3 is used to form pull-down transistor PD1. The arms of U-shaped active region OD4 are used to form pass-gate transistors PGA2 and PGB2, while the bottom part of U-shaped active region OD4 is used to form pull-down transistor PD2.

Due to process reasons, the formation of the U-shaped active regions OD3 and OD4 is difficult. Accordingly, the formation of each of U-shaped active regions OD3 and OD4 is performed using double patterning technology, which means a part of each of the active regions OD3 and OD4 is on a first lithography mask of a double patterning mask set, while a part of each of active regions OD3 and OD4 is on a second lithography mask of the same double patterning mask set. FIGS. 11 and 12 illustrate the patterns in the first and the second lithography masks, respectively.

FIG. 11 illustrates the first lithography mask including active regions OD1 and OD2. Active regions OD3A and OD4A include some, but not all, bottom parts of the active regions OD3 and OD4, respectively (please also refer to FIG. 10B). FIG. 12 illustrates the second lithography mask, wherein active regions OD3B and OD4B include the arm parts and some, but not all, bottom parts of the active regions OD3 and OD4, respectively (please also refer to FIG. 10B).

Figure 10B:
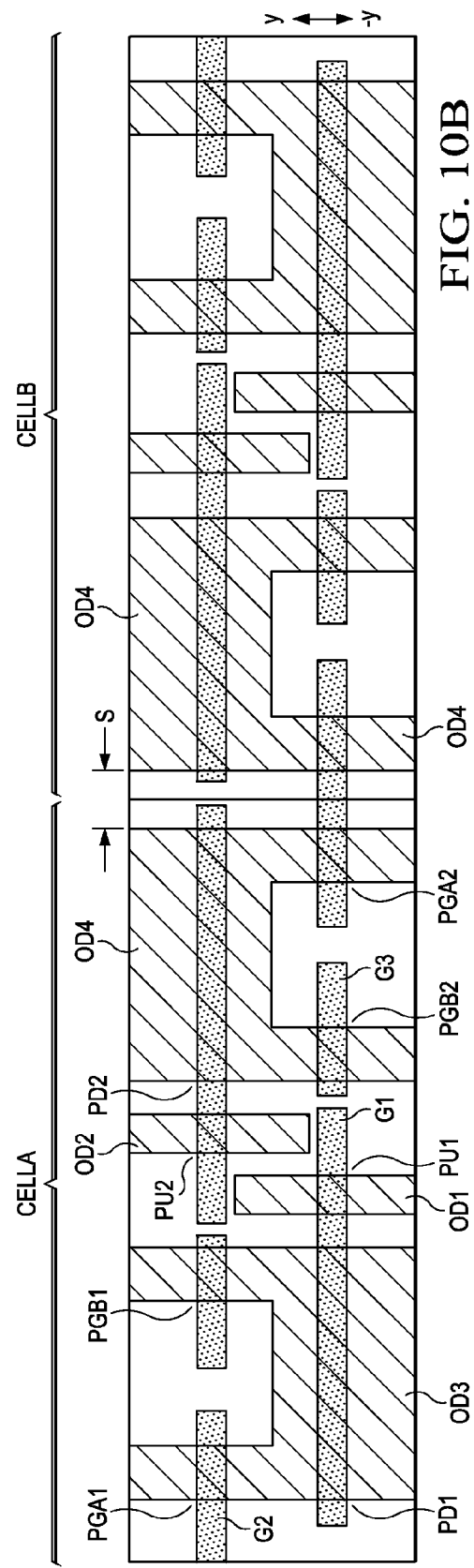
Figure 13:
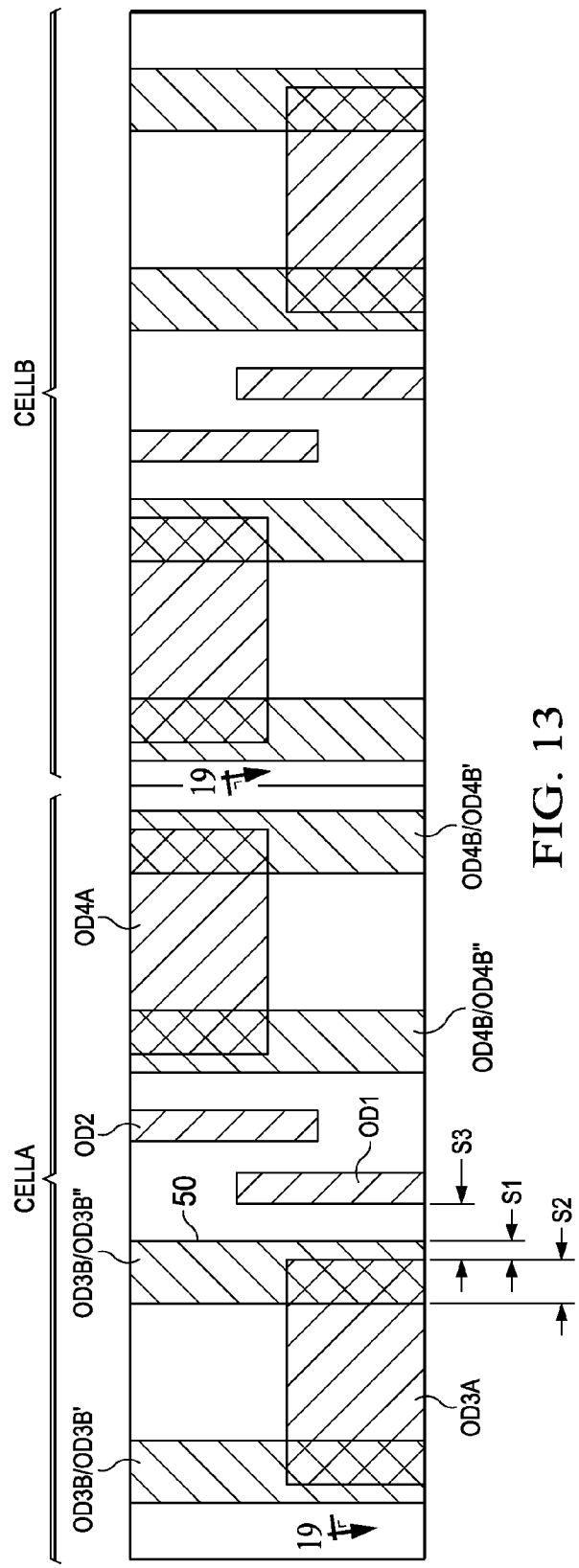

In the manufacturing process for transferring the patterns in FIGS. 11 and 12 to physical wafers, the first and the second lithography masks need to be aligned to each other. FIG. 13 illustrates the alignment of the patterns in FIGS. 11 and 12. It is observed that patterns OD3A and OD3B (including OD3B' and OD3B") overlap each other to form the pattern of active OD3 (FIG. 10B), while patterns OD4A and OD4B (including OD4B' and OD4B") overlap each other to form the pattern of active OD4 (FIG. 10B). Accordingly, the U-shaped active regions OD3 and OD4 may be implemented.

Figure 14:
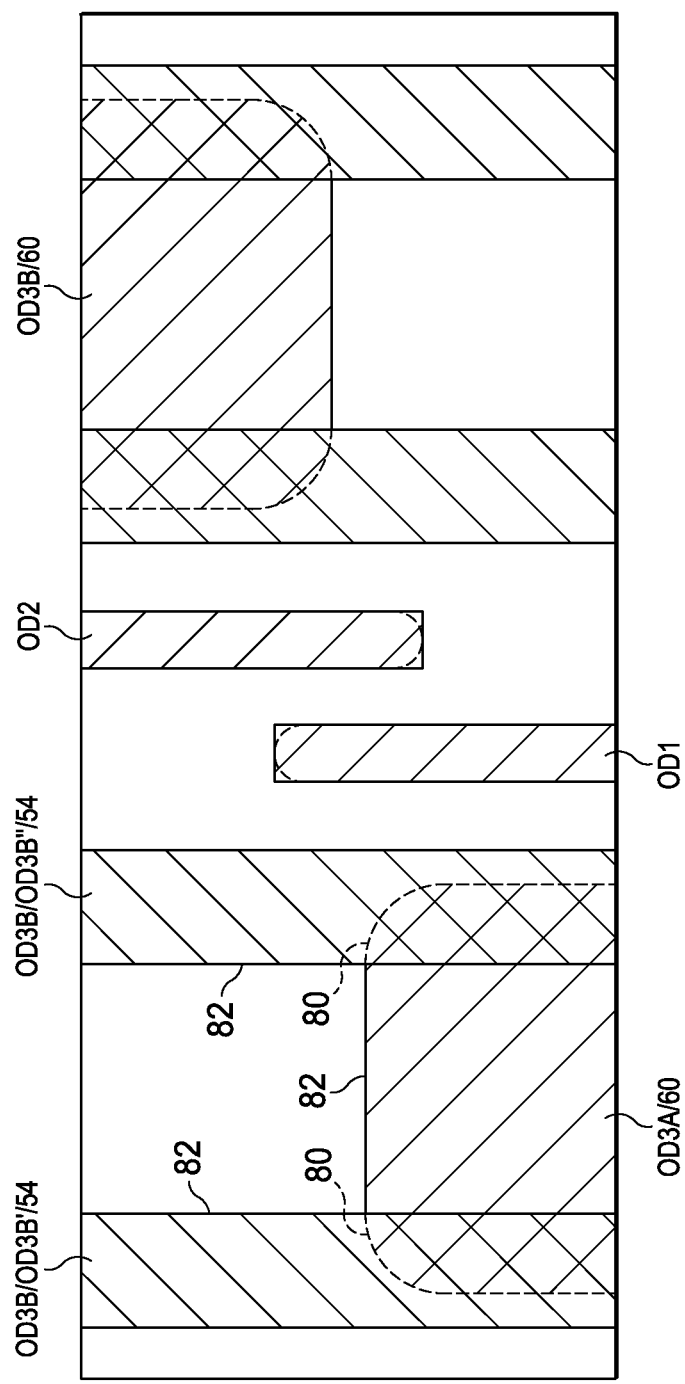

In an embodiment, active region patterns OD3A and OD3B' overlap, with the overlapping width S2 being a non-zero value. Overlapping width S2 is selected as a minimum value that will ensure even if process variation occurs, active region patterns OD3A will not extend to the right of the right edge of OD3B", and will not extend to the left of the left edge of OD3B'. In an exemplary embodiment, overlapping width S2 is greater than about 10 nm, and may be greater than about 75 nm. Overlapping width S2 is selected so that the rounded corners 80 (please refer to FIG. 14) of active region OD3A overlap active regions OD3B' and OD3B", and hence are hidden. The further selection rule of overlapping width S2 is illustrated in FIG. 14. Spacing S1 between edge 50 of active region OD3B" (which edge faces active region OD1) and the respective edge of active region OD1 may also be a non-zero value, and may be greater than about 3 nm, for example. S1 is selected so that the space (S3) of OD1 and OD3A can be reasonably large for OD1 and OD3A to be patterned on the same mask. The optimum S1 and S2 values may be obtained through experiment by selecting a minimum value that will cause rounded corners 40 to be reliably hidden. With spacing S1 being greater than zero, the spacing S3 between active region patterns OD3A and OD1 may be increased. Since active region patterns OD3A and OD1 are on a same lithography mask, such a design may help the reduction of the size of SRAM cells.

Figure 15:
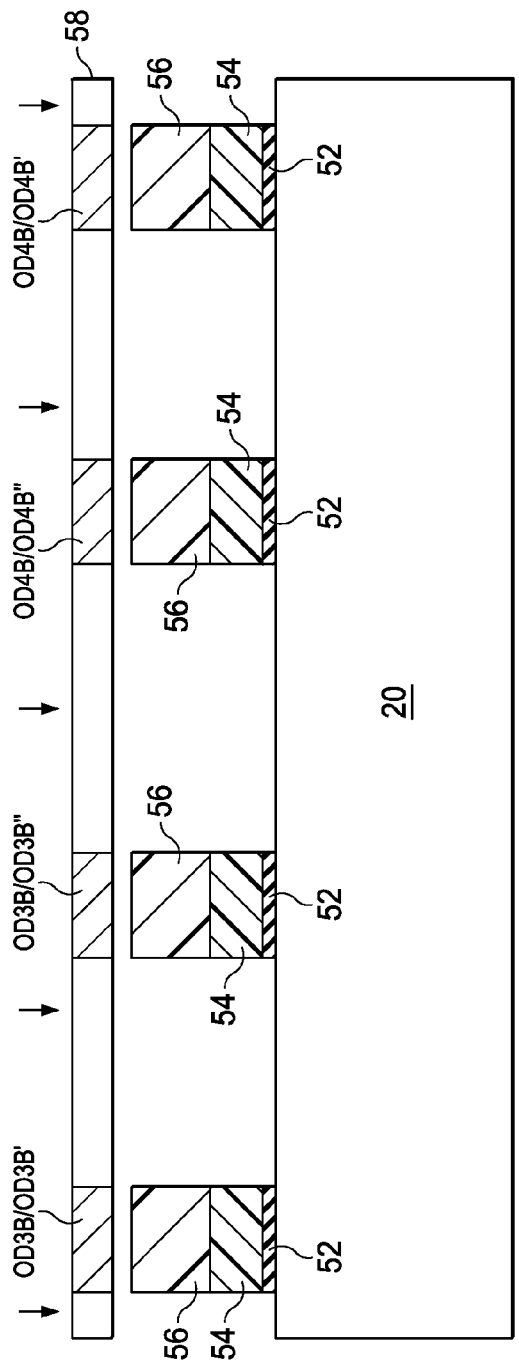
FIGS. 15 through 19 are cross-sectional views of intermediate stages in the manufacturing of active regions of an SRAM cell comprising U-shaped active regions.

FIGS. 15 through 19 illustrate the cross-sectional views of intermediate stages in the manufacturing of transistors and respective active regions in SRAM cells. Again, the formation of transistors and respective active regions using the lithography masks as discussed in previous paragraphs may have many embodiments, which are also in the scope of the present disclosure, and the embodiments shown in FIGS. 15 through 19 are exemplary. The cross-sectional views may be obtained from the plane crossing line 19-19 in FIG. 13. Referring to FIG. 15, semiconductor substrate 20 is provided. Pad oxide layer 52, which may be formed silicon oxide, is formed. Hard mask layer 54 is formed over pad oxide layer 52. Photo resist 56 is also formed. The patterning of pad oxide layer 52, hard mask 54, and photo resist 56 are performed using lithography mask 58, which includes the patterns of active regions OD3B and OD4B as shown in FIG. 12.

Figure 16:
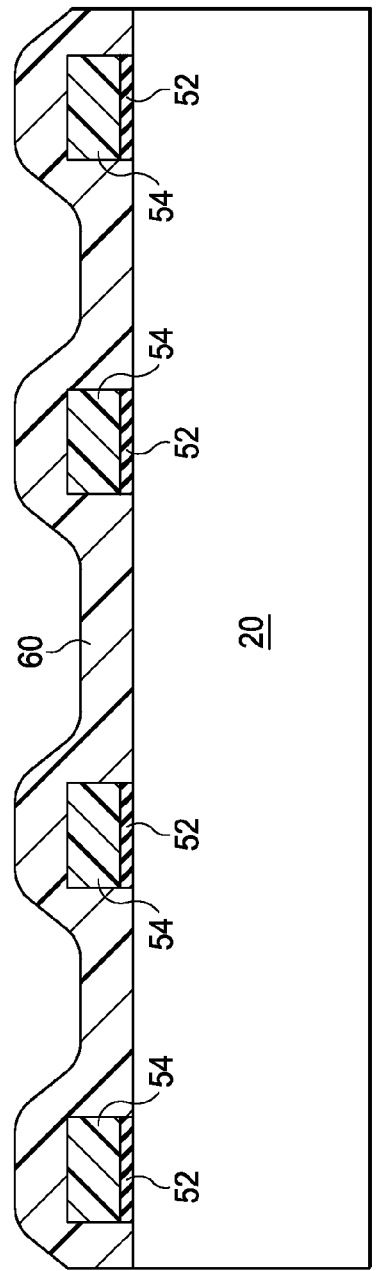
Figure 17:
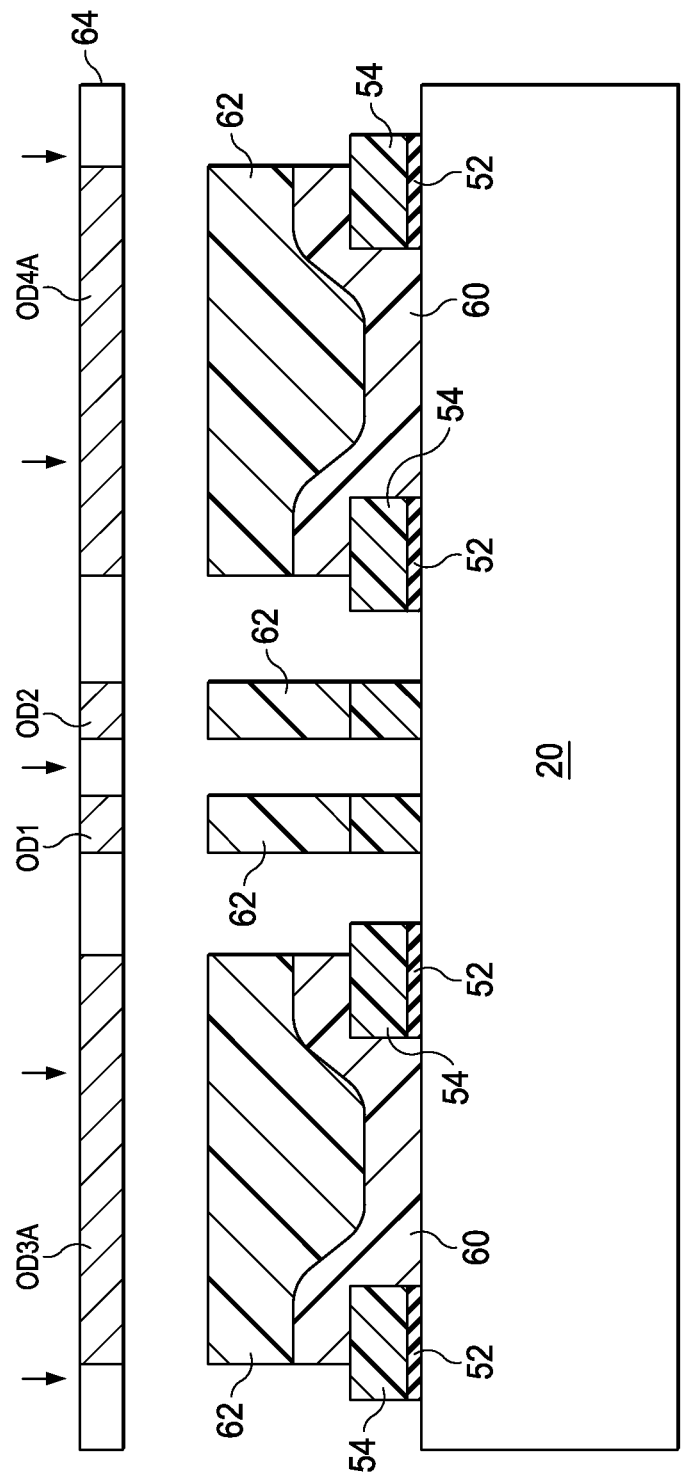

Next, as shown in FIG. 16, photo resist 56 is removed, leaving patterned hard mask 54 and pad oxide 52. In FIG. 17, another hard mask layer 60 is formed to cover the structure shown in FIG. 15. Photo resist 62 is also formed, as shown in FIG. 17. Hard masks 54 and 60 and photo resists 56 and 62 may also be composite layers. Hard mask layer 60 is then patterned. The patterning of hard mask 60 is performed using lithography mask 64, which includes the patterns of active regions OD1, OD2, OD3A, and OD4A, as shown in FIG. 11. In the resulting structure, some remaining parts of hard mask 60 are stacked on, and hence overlap, parts of hard mask 54.

Figure 18:
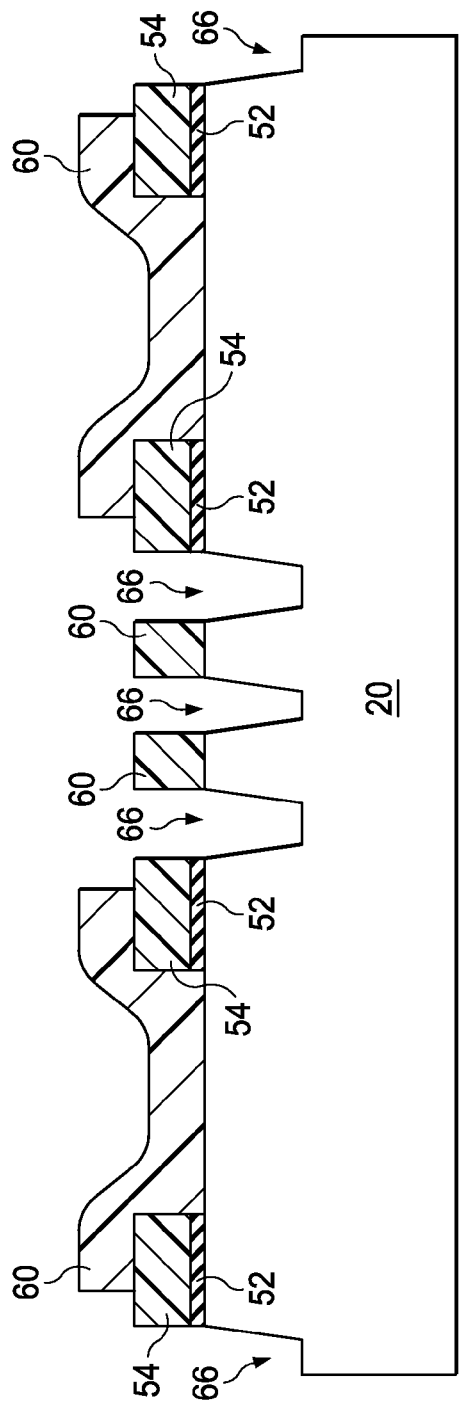
Figure 19:
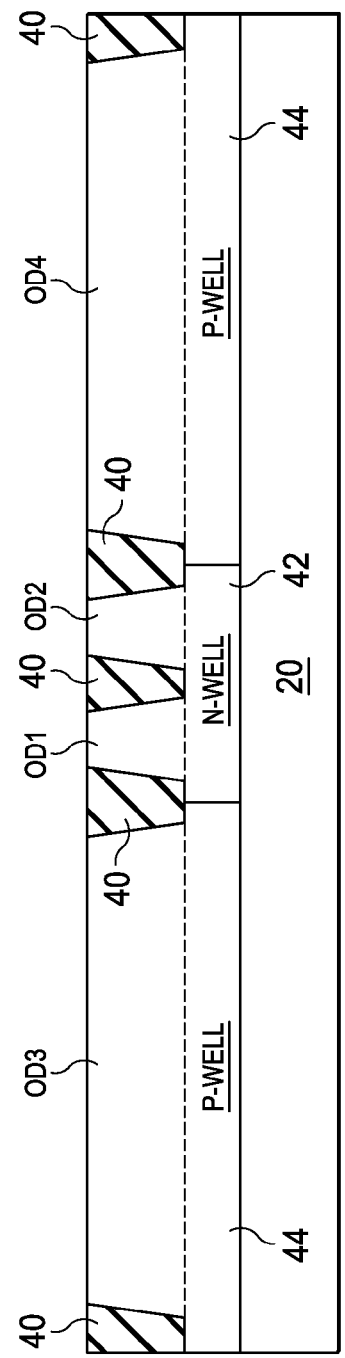

FIG. 18 illustrates the etching of semiconductor substrate 20 using patterned hard mask 54 and 60 to form trenches 66. It is observed that in the formation of trenches 66, only the parts of substrate 20 not covered by hard mask 54 and 60 are etched, while the parts of substrate 20 covered by any of hard masks 54 and 60 are not etched. Accordingly, the overlapping of patterns of OD3A/OD3B and OD4A/OD4B (FIG. 13) is achieved. In FIG. 19, trenches 66 are filled with dielectric materials to form STI regions 40. Further, one or more n-type impurity implantation may be performed to form n-well region 42 in semiconductor substrate 20, and one or more p-type impurity implantation may be performed to form p-well regions 44 in semiconductor substrate 20. The portions of n-well region 42 surrounded by STI regions 40 form active regions OD1 and OD2, and the portions of p-well region 44 surrounded by STI regions 40 form active regions OD3 and OD4.

In subsequent process steps, gate dielectrics, gate electrodes, source and drain regions (not shown), and the like, are formed to finish the formation of the transistors in FIGS. 10A and 10B. The formation details are known in the art, and hence are not discussed herein.

FIG. 14 schematically illustrates the top view of the actual active regions after the process as shown in FIGS. 15 through 19 is finished. It is observed that due to optical effects, the portions of hard masks 60 (FIGS. 17 and 18) corresponding to active region patterns OD3A OD3B (FIG. 11) have rounded corners 80. In order to form straight edges 82 for active region OD3 (FIG. 10B), rounded corners 80 need to overlap the portions of hard masks 54 (FIG. 17) corresponding to active region patterns OD3B' and OD3B" (FIG. 11), and hence the rounded corners are hidden. As a result, the resulting active regions OD3 and OD4 may have good U-shaped profile with straight edges 82 that are not affected by optical effects. As a result, referring to FIG. 10B, even if process variation occurs, and gate electrodes G1, G2, and/or G3 shifts in +y or −y directions, the gate lengths of the respective transistors PGA1, PD1, and PGB1 will not change, and hence the performance of the respective SRAM cell will not be affected.

In the embodiments shown in FIGS. 15 through 19, the order of using lithography masks 58 (FIG. 15) and 64 (FIG. 17) to form hard masks may also be reversed without affect the resulting active regions.

In the embodiments, by placing the active regions of two pull-up transistors in an SRAM cell in a same lithography mask of a double patterning mask set, the mismatch between two sides of the SRAM cell, and/or between two ports of the SRAM cell, is reduced. Further, by forming active regions using lithography masks with overlapped active region patterns, better profile of active regions may be achieved, and the performance variation caused by the shift in gate electrodes is reduced.

In accordance with embodiments, a method includes forming an SRAM cell including a first and a second pull-up transistor and a first and a second pull-down transistor. The step of forming the SRAM cell includes forming a first and a second active region of the first and the second pull-up transistors using a first lithography mask, and forming a third and a fourth active region of the first and the second pull-down transistors using a second lithography mask.

In accordance with other embodiments, a method includes forming an SRAM cell including a first and a second pull-up transistor and a pull-down transistor, wherein active regions of the first and the second pull-up transistor and the pull-down transistor are connected to form a U-shaped active region. The step of forming the SRAM cell includes forming a first arm of the U-shaped active region using a first lithography mask of a doubling-patterning mask set, wherein the first arm forms an active region of the first pull-up transistor; forming a second arm of the U-shaped active region using the first lithography mask, wherein the second arm forms an active region of the second pull-up transistor; and forming a bottom part of the U-shaped active region using the first lithography mask and a second lithography mask of the doubling-patterning mask set, wherein the bottom part forms an active region of the pull-down transistor.

In accordance with yet other embodiments, a method includes forming an SRAM cell including a first and a second pull-up transistor, a pull-down transistor, and a first and a second pass-gate transistor. The step of forming the SRAM cell includes forming a first and a second active region of the first and the second pull-up transistors in a semiconductor substrate using a first lithography mask of a double-patterning mask set; forming a third and a fourth active region of the first and the second pass-gate transistors in the semiconductor substrate using a second lithography mask of the double-patterning mask set; and forming a fifth active region of the pull-down transistor in the semiconductor substrate using both the first and the second lithography masks.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a static random access memory (SRAM) cell comprising a first and a second pull-up transistor and a first and a second pull-down transistor, the step of forming the SRAM cell comprising:
        forming first shallow trench isolation regions in a semiconductor substrate using a first lithography mask, wherein the first shallow trench isolation regions define first portions of the semiconductor substrate as a first and a second active region of the first and the second pull-up transistors, respectively; and
        forming second shallow trench isolation regions in the semiconductor substrate using a second lithography mask, wherein the second shallow trench isolation regions define second portions of the semiconductor substrate as a third and a fourth active region of the first and the second pull-down transistors, respectively.

2. The method of claim 1, wherein the first and the second active regions of the first and the second pull-up transistors are immediately next to each other, with no other active region of other transistors disposed therebetween.

3. The method of claim 1 further comprising forming an additional SRAM cell immediately neighboring the SRAM cell, wherein the third active region of the first pull-down transistor and an active region of a pull-down transistor in the additional SRAM cell are immediately next to each other, with no other active region of other transistors disposed therebetween.

4. The method of claim 1, wherein the first shallow trench isolation regions comprises a portion between and adjoining the first and the second active regions.

5. The method of claim 4, wherein the first, the second, the third, and the fourth active regions are allocated in a rotational symmetrical pattern.

6. The method of claim 1, wherein the first and the second active regions are between the third and the fourth active regions.

7. The method of claim 1 further comprising forming a first and a second pass-gate transistors of the SRAM cell, wherein active regions of the first and the second pass-gate transistors form large active regions with the third and the fourth active regions, respectively.

8. The method of claim 1, wherein the SRAM cell further comprises a read pass-gate transistor and a read pull-down transistor, and wherein the method further comprises forming additional shallow trench isolation regions to define an active region of the read pass-gate transistor and the read pull-down transistor using the first lithography mask.

9. The method of claim 1 further comprising forming an additional SRAM cell comprising an additional first and an additional second pull-up transistor and an additional first and an additional second pull-down transistor, the step of forming the additional SRAM cell comprising:
    forming first additional shallow trench isolation regions to define a fifth and a sixth active region of the additional first and the additional second pull-up transistors using the first lithography mask; and
    forming second additional shallow trench isolation regions to define a seventh and a eight active region of the additional first and the additional second pull-down transistors using the second lithography mask.

10. The method of claim 1 further comprising forming an additional SRAM cell comprising an additional first and an additional second pull-up transistor and an additional first and an additional second pull-down transistor, the step of forming the additional SRAM cell comprising:
    forming first additional shallow trench isolation regions to define a fifth and a sixth active region of the additional first and the additional second pull-up transistors using the second lithography mask; and
    forming second additional shallow trench isolation regions to define a seventh and a eight active region of the additional first and the additional second pull-down transistors using the first lithography mask.

11. The method of claim 1, wherein the third and the fourth active regions are portions of U-shaped active regions, each comprising two arms and one bottom part, wherein the two arms of each of the U-shaped active regions are defined using the second lithography mask, and wherein the bottom parts of the U-shaped active regions active regions are defined using both the first and the second lithography masks.

12. A method comprising:
    forming a static random access memory (SRAM) cell comprising a first and a second pull-up transistor and a pull-down transistor, wherein active regions of the first and the second pull-up transistor and the pull-down transistor are connected to form a U-shaped active region, the step of forming the SRAM cell comprising:
        forming a first shallow trench isolation region in a semiconductor substrate to define a first arm of the U-shaped active region using a first lithography mask of a doubling-patterning mask set, wherein the first arm forms an active region of the first pull-up transistor;

forming a second shallow trench isolation region in the semiconductor substrate to define a second arm of the U-shaped active region using the first lithography mask, wherein the second arm forms an active region of the second pull-up transistor; and forming a third shallow trench isolation region in the semiconductor substrate to define a bottom part of the U-shaped active region using the first lithography mask and a second lithography mask of the doubling-patterning mask set, wherein the bottom part forms an active region of the pull-down transistor.

13. The method of claim 12, wherein the steps of forming the first arm, the second arm, and the bottom part of the U-shaped active region comprises:

transferring patterns in the first lithography mask to a first hard mask over the semiconductor substrate to form a first plurality of hard mask features;

transferring patterns in the second lithography mask to a second hard mask over the semiconductor substrate to form a second plurality of hard mask features, wherein portions of the second plurality of hard mask features are formed directly over portions of the first plurality of hard mask features; and transferring patterns of the first and the second plurality of hard mask features in combination to the semiconductor substrate to form the U-shaped active region.

14. The method of claim 13, wherein the step of transferring of the first and the second plurality of hard mask features comprises:

etching the semiconductor substrate using the first and the second plurality of hard mask features as a mask to form trenches;

filling the trenches with a dielectric material to form the first, the second, and the third shallow trench isolation regions; and implanting portions of the semiconductor substrate surrounded by the first, the second, and the third shallow trench isolation regions to form the U-shaped active region.

15. The method of claim 13, wherein the SRAM cell further comprises a first and a second pull-up transistor, and wherein the method further comprises defining active regions of the first and the second pull-up transistors using the second lithography mask.

16. A method comprising:

forming a static random access memory (SRAM) cell comprising a first and a second pull-up transistor, a pull-down transistor, and a first and a second pass-gate transistor, the step of forming the SRAM cell comprising:

forming first Shallow Trench Isolation (STI) regions in a semiconductor substrate using a first lithography mask of a double-patterning mask set, wherein the first STI regions define first portions of the semiconductor substrate as a first and a second active region of the first and the second pull-up transistors, respectively, and wherein the first and the second active regions are immediately next to each other, with no other active region of other transistors disposed therebetween;

forming second STI regions in the semiconductor substrate using a second lithography mask of the double-patterning mask set, wherein the second STI regions define second portions of the semiconductor substrate as a third and a fourth active region of the first and the second pass-gate transistors, respectively; and forming a third STI region in the semiconductor substrate, wherein the third STI region defines a third portion of the semiconductor substrate as a fifth active region of the pull-down transistor in the semiconductor substrate, and wherein the third STI region is formed using both the first and the second lithography masks.

17. The method of claim 16, wherein the third, the fourth, and the fifth active regions are connected with each other to form a continuous active region.

18. The method of claim 16, wherein the steps of forming the third, the fourth, and the fifth active regions comprise:

transferring patterns in the first lithography mask and corresponding to the third and a fourth active regions to a first hard mask layer over the semiconductor substrate to form a first and a second hard mask strips;

transferring patterns in the second lithography mask and corresponding to the fifth active region to a second hard mask layer over the semiconductor substrate to form a rectangular hard mask feature, wherein opposite edge portions of the rectangular hard mask feature overlap a portion of each of the first and the second hard mask strips to form a U-shaped hard mask; and transferring the pattern of the U-shaped hard mask to the semiconductor substrate to form a U-shaped active region.

19. The method of claim 18, wherein an overlap width of the portion of each of the first and the second hard mask strips is greater than about 10 nm.

20. The method of claim 18, wherein a portion of the second hard mask layer further comprises an additional hard mask strip corresponding to the first active region, and wherein a first spacing between the additional hard mask strip and the rectangular hard mask feature is greater than a second spacing between the additional hard mask strip and one of the first and the second hard mask strips.

* * * * *

UNITED STATES PATENT AND TRADEMARK OFFICE
CERTIFICATE OF CORRECTION

Page 1 of 1

PATENT NO.        : 8,642,451 B2
APPLICATION NO.   : 12/917205
DATED             : February 4, 2014
INVENTOR(S)       : Feng-Ming Chang It is certified that error appears in the above-identified patent and that said Letters Patent is hereby corrected as shown below:

In the Claims

In Col. 8, line 53, claim 11, delete "active regions active regions" and insert --active regions--.

Signed and Sealed this
Fifteenth Day of April, 2014

Michelle K. Lee
*Deputy Director of the United States Patent and Trademark Office*